(12) United States Patent
Keskin et al.

(10) Patent No.: US 7,940,100 B2
(45) Date of Patent: May 10, 2011

(54) DELAY CIRCUITS MATCHING DELAYS OF SYNCHRONOUS CIRCUITS

(75) Inventors: Mustafa Keskin, San Diego, CA (US); Marzio Pedrali-Noy, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/860,472

(22) Filed: Sep. 24, 2007

(65) Prior Publication Data
US 2009/0079483 A1 Mar. 26, 2009

(51) Int. Cl.
*H03L 7/06* (2006.01)
(52) U.S. Cl. .......................... 327/161; 327/261
(58) Field of Classification Search .......................... None
See application file for complete search history.

(56) References Cited

U.S. PATENT DOCUMENTS

| | | | |
|---|---|---|---|
| 6,362,657 B1 | 3/2002 | Mooney | |
| 6,829,715 B2 | 12/2004 | Chiao et al. | |
| 7,003,060 B2 | 2/2006 | Naka et al. | |
| 7,102,407 B2 * | 9/2006 | Slawecki | 327/263 |
| 7,194,053 B2 | 3/2007 | Yoh et al. | |
| 7,292,672 B2 | 11/2007 | Isono | |
| 7,490,257 B2 * | 2/2009 | Endo | 713/401 |
| 2005/0007170 A1 * | 1/2005 | Nakahara et al. | 327/199 |
| 2007/0035338 A1 * | 2/2007 | Jung | 327/199 |

OTHER PUBLICATIONS

"International Search Report and Written Opinion—PCT/US2008/077404, International Search Authority—European Patent Office—Mar. 3, 2009".

* cited by examiner

*Primary Examiner* — Cassandra Cox
(74) *Attorney, Agent, or Firm* — Ramin Mobarhan

(57) ABSTRACT

Delay circuits capable of providing delays closely matching propagation delays of synchronous circuits are described. In one design, an apparatus includes a synchronous circuit and a delay circuit. The synchronous circuit includes a forward path from a data input to a data output. The synchronous circuit receives input data and provides output data with a propagation delay. The delay circuit receives an input signal and provides a delayed input signal having a delay matching the propagation delay of the synchronous circuit. The delay circuit includes at least two logic gates in the forward path of the synchronous circuit. The synchronous and delay circuits may be implemented based on the same or similar circuit architecture. The delay circuit may be based on a replica of the synchronous circuit, with the replica having feedback loops broken and clock input coupled to appropriate logic value to always enable the delay circuit.

25 Claims, 10 Drawing Sheets

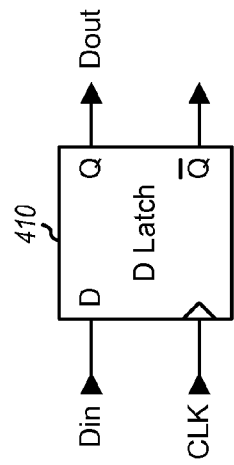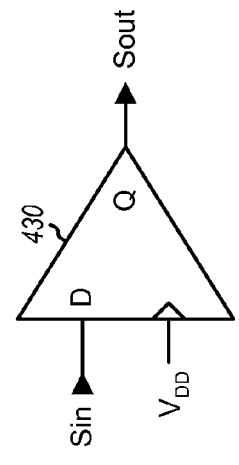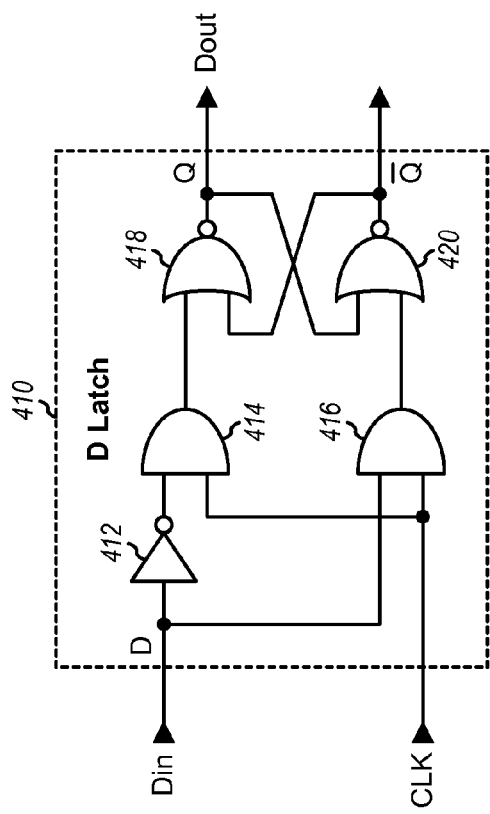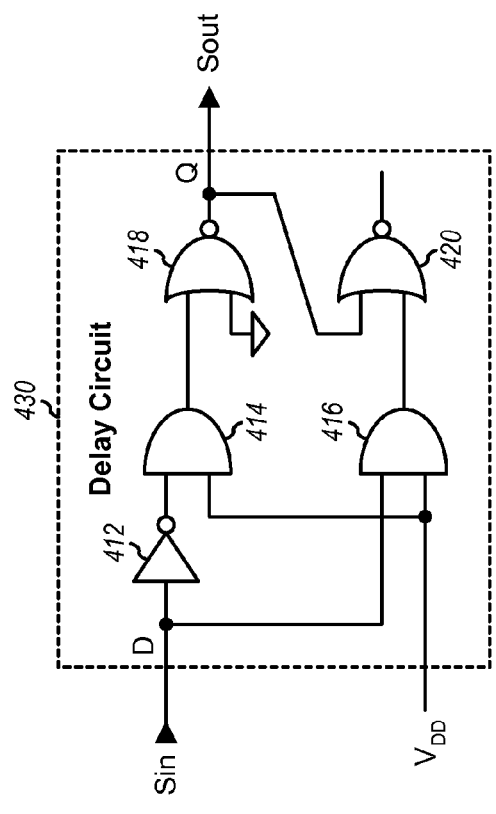
FIG. 4A
FIG. 4B

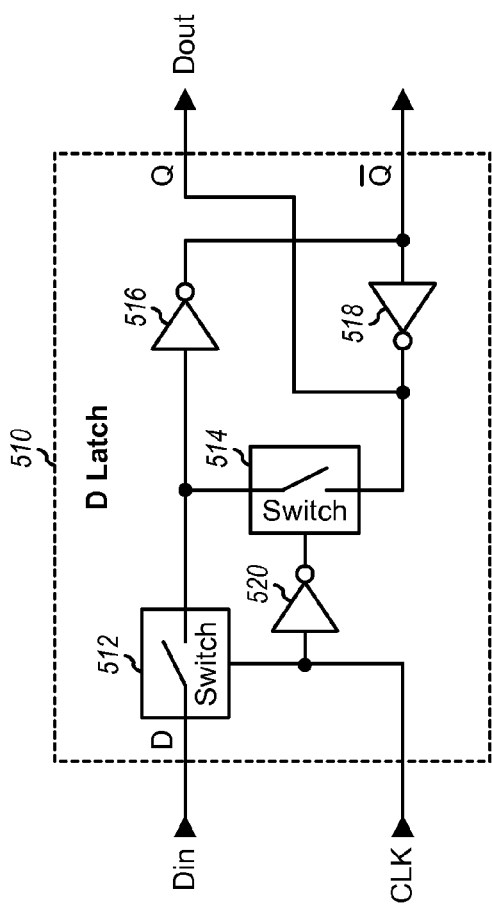
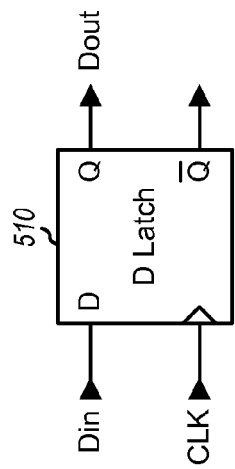
FIG. 5A
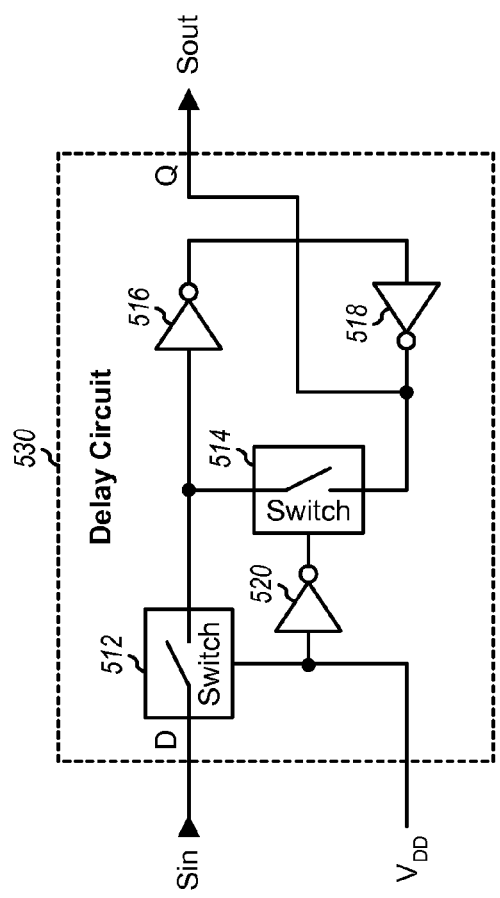
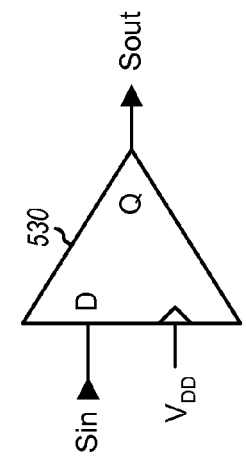
FIG. 5B

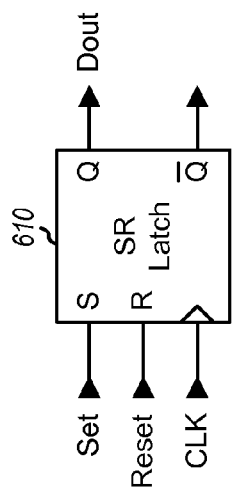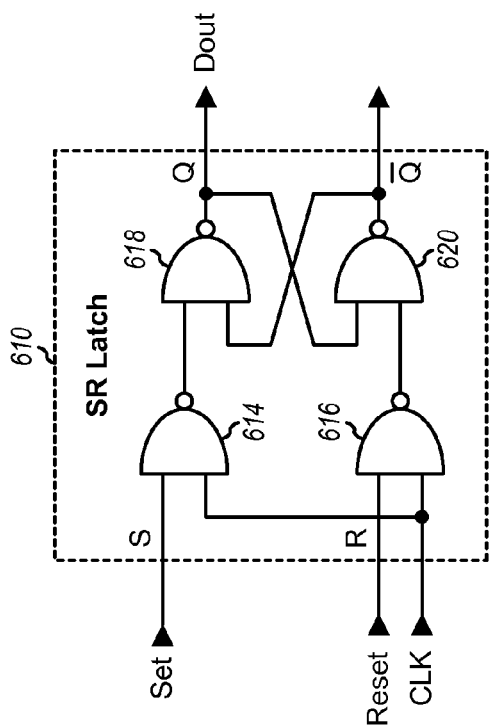
FIG. 6A
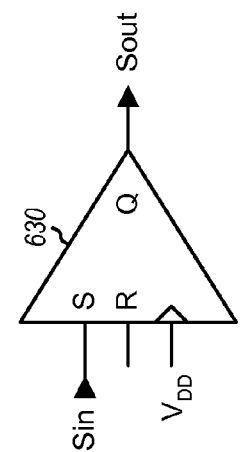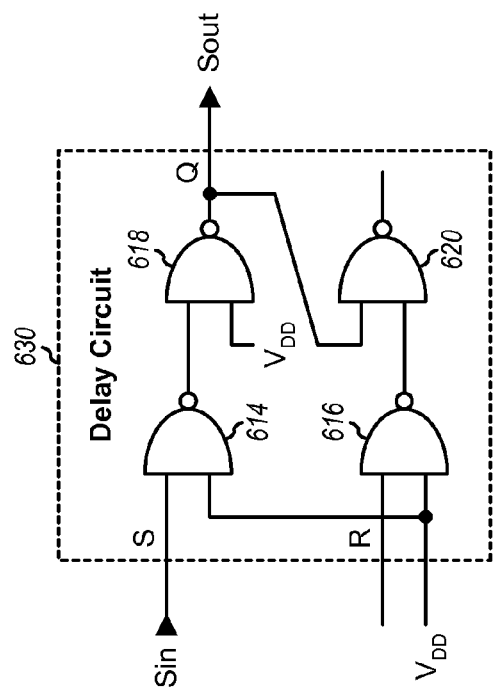
FIG. 6B

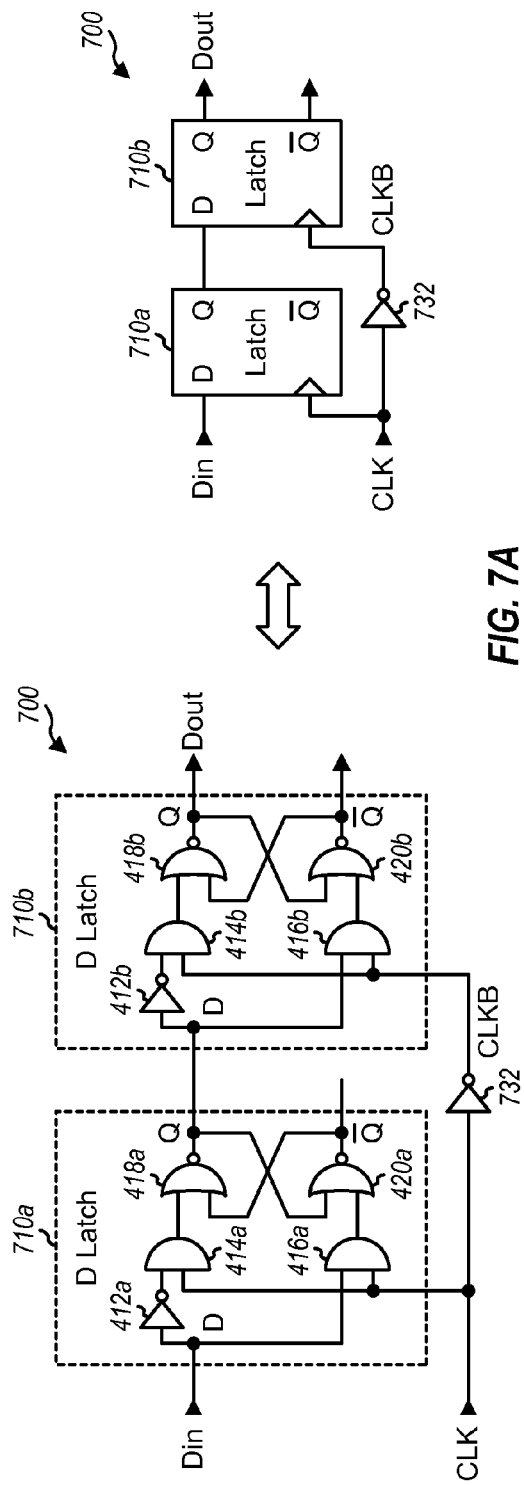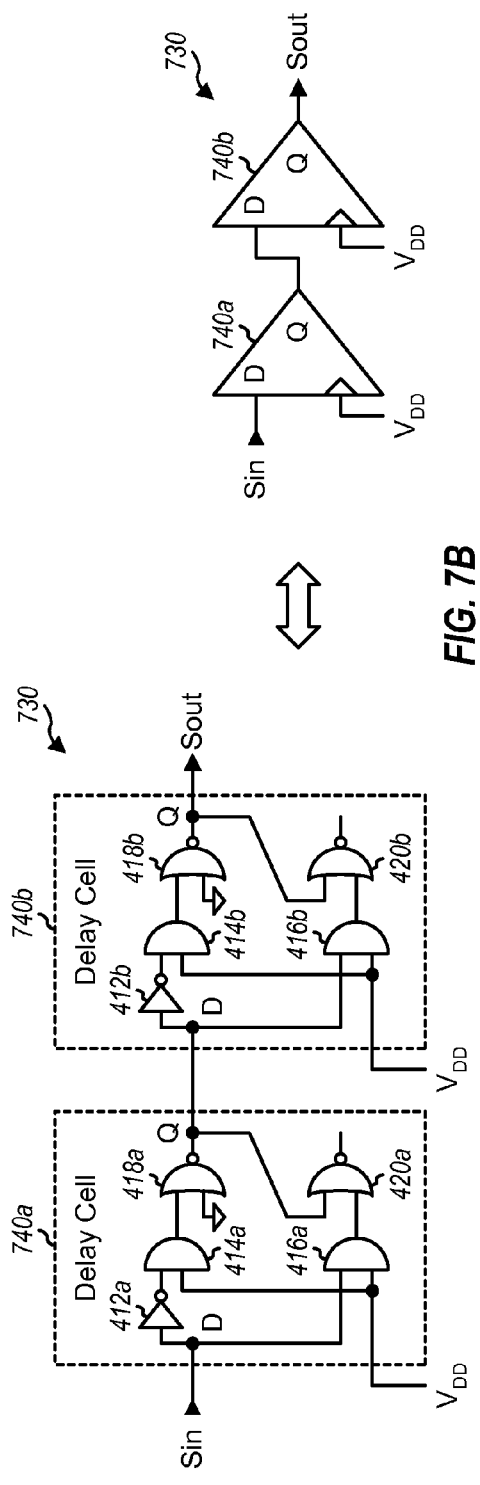
FIG. 7A
FIG. 7B

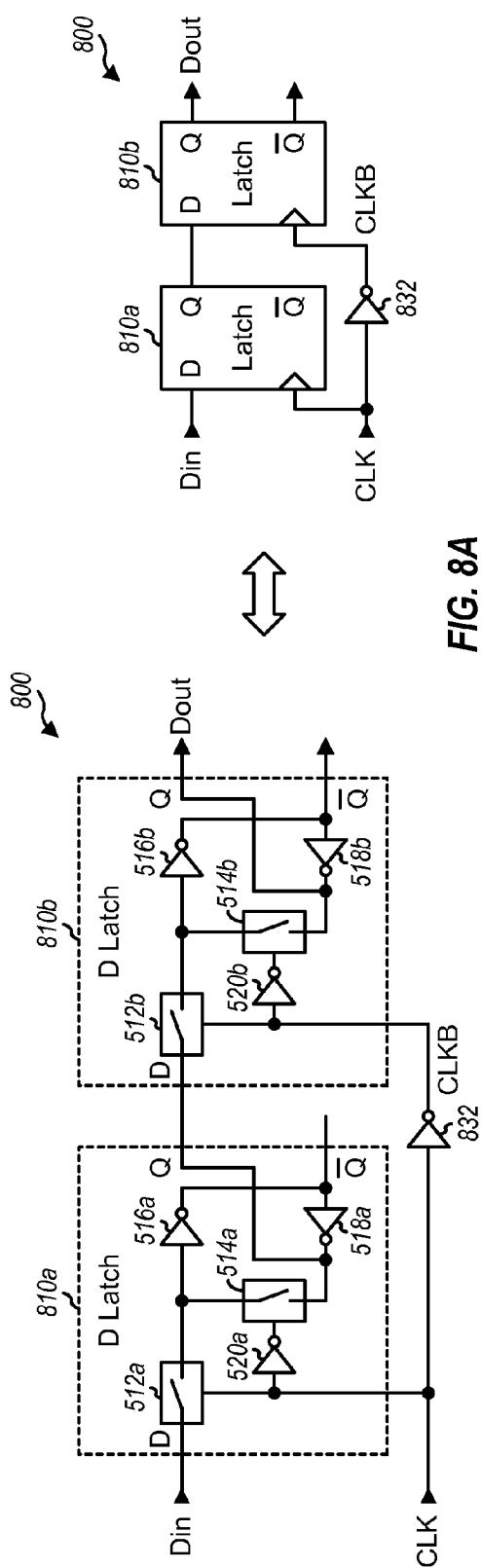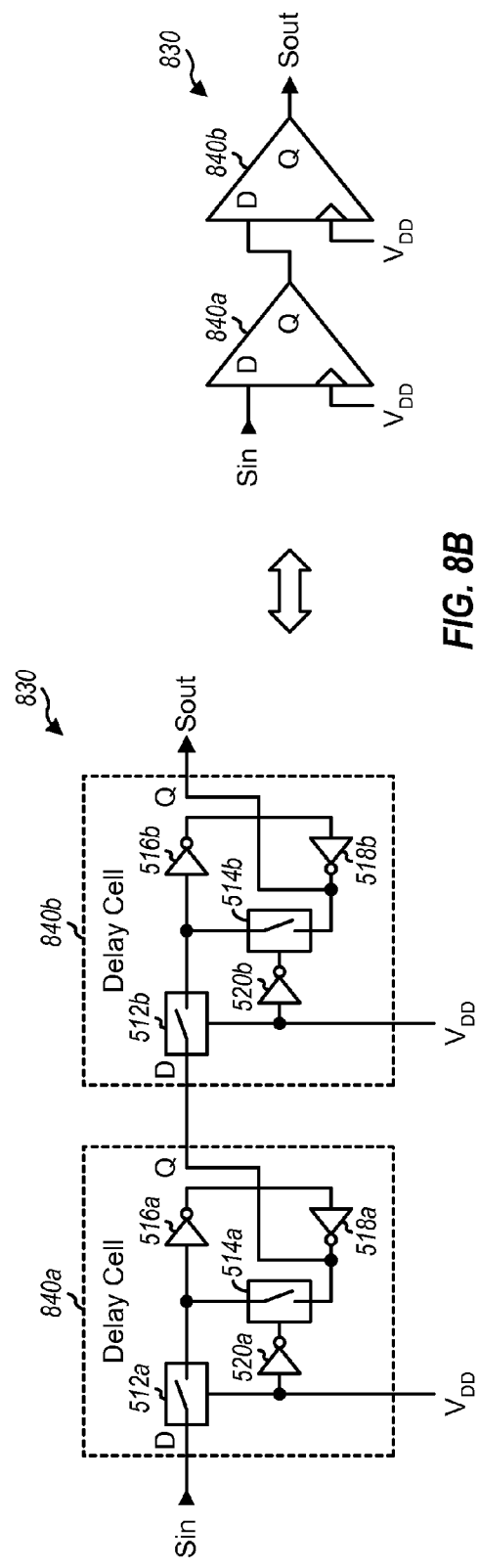

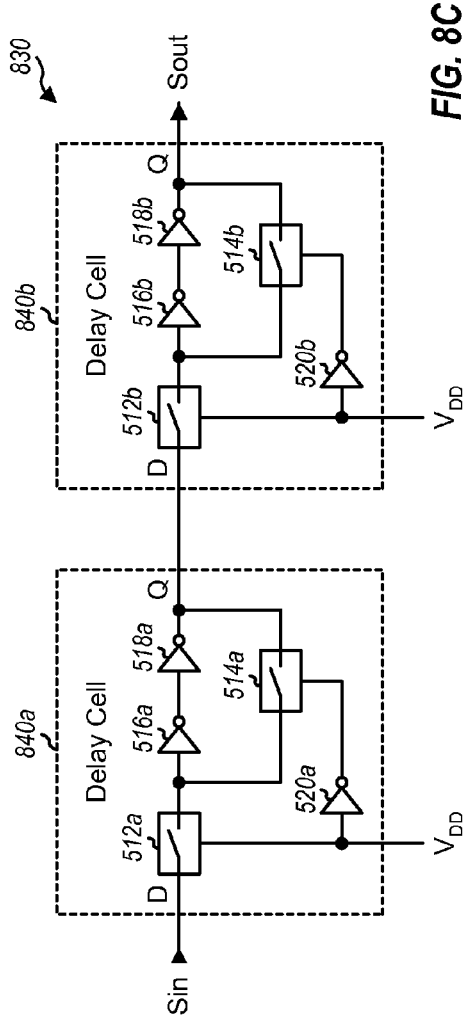
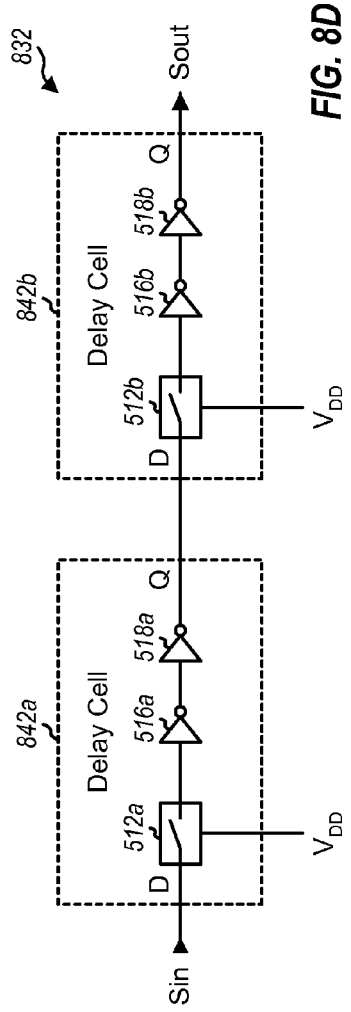

DELAY CIRCUITS MATCHING DELAYS OF SYNCHRONOUS CIRCUITS

BACKGROUND

I. Field

The present disclosure relates generally to electronics circuits, and more specifically to delay circuits.

II. Background

Synchronous circuits are circuits whose operation can be controlled by control signals such as clock signals, strobe signals, enable signals, etc. Synchronous circuits are in contrast to combinatorial circuits that can change their outputs whenever their inputs change. Some examples of synchronous circuits include latches and flip-flops, which may be operated in a synchronized manner based on a common clock signal.

Synchronous circuits such as latches and flip-flops are widely used in various digital circuit designs. A latch is a circuit that can store one bit of information and can be controlled by a control signal such as a clock signal. A flip-flop is a circuit that can store one bit of information and can capture input data based on clock edges. A main difference between a latch and a flip-flop is transparency, which relates to how data is captured and maintained. For a latch, the output may follow the input when the control signal is at high logic, an input data value may be captured when the control signal transitions to logic low, and the captured value may be retained while the control signal is at logic low. For a flip-flop, an input data value may be captured at one edge (e.g., rising edge) of the clock signal, and the captured value may be provided to the output at the other edge (e.g., falling edge) of the clock signal. Hence, the output of the flip-flop is non-transparent to the input. The terms "latch" and "flip-flop" are often used interchangeably when the distinction between their manners of operation is not important. Multiple flip-flops may be coupled in parallel or in series to form a register for any number of bits.

Synchronous circuits have certain propagation delays between their inputs and outputs. The propagation delays may be due to logic gates used to implement the synchronous circuits and may vary widely due to variations in integrated circuit (IC) process, power supply voltage, and temperature (PVT). When synchronous circuits are used in high-speed digital circuits, it may be desirable or necessary to account for the propagation delays of the synchronous circuits across PVT variations in order to support high operating speed and achieve good timing margins.

SUMMARY

Delay circuits capable of providing delays closely matching the propagation delays of synchronous circuits are described herein. These delay circuits may be used in high-speed digital circuits such as interface circuits where high operating speed is desired.

In one design, an apparatus comprises a synchronous circuit and a delay circuit. The synchronous circuit comprises a forward path from a data input to a data output, and the forward path may be implemented with logic gates such as inverter, AND gate, NAND gate, NOR gate, switch, etc. The synchronous circuit receives input data and provides output data with a propagation delay. The delay circuit receives an input signal (e.g., a clock signal for the synchronous circuit) and provides a delayed input signal (e.g., a delayed clock signal) having a delay matching the propagation delay of the synchronous circuit. The delay circuit comprises at least two logic gates in the forward path of the synchronous circuit.

To achieve good delay matching, the synchronous circuit and the delay circuit may be implemented based on the same or similar circuit architecture. The delay circuit may be based on a replica of the synchronous circuit, with the replica having its clock input coupled to a static logic value to always enable the delay circuit. The delay circuit may comprise all logic gates in the forward path of the synchronous circuit.

The synchronous circuit may comprise a latch having a pair of logic gates (e.g., inverters, NOR gates, or NAND gates) coupled in a feedback configuration. The delay circuit may comprise the same pair of logic gates, albeit with the feedback broken.

The synchronous circuit may comprise a flip-flop having first and second latches coupled in series, with the first latch receiving the input data and a clock signal, and the second latch receiving an inverted clock signal and providing the output data. The delay circuit may comprise first and second delay cells coupled in series, with the first delay cell receiving the input signal and the second delay cell providing the delayed input signal. Each delay cell may be based on a replica of the corresponding latch in the synchronous circuit.

Various aspects and features of the disclosure are described in further detail below.

BRIEF DESCRIPTION OF THE DRAWINGS

FIGS. 4A and 4B show a D latch and a corresponding delay circuit.

FIGS. 5A and 5B show another D latch and a corresponding delay circuit.

FIGS. 6A and 6B show an SR latch and a corresponding delay circuit.

FIGS. 7A and 7B show a D flip-flop and a corresponding delay circuit.

FIGS. 8A to 8D show another D flip-flop and corresponding delay circuits.

DETAILED DESCRIPTION

The delay circuits described herein may be used to match the delays of synchronous circuits such as latches, flip-flops, etc. The delay circuits may be used for interface circuits between different devices such as CPUs and memories, which may be implemented on the same IC or different ICs. The delay circuits may also be used for internal circuits within a given device or IC.

Figure 1:
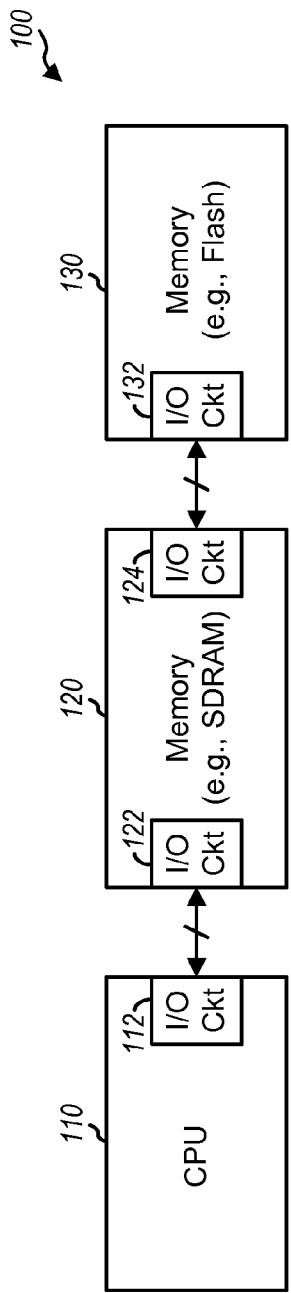
FIG. 1 shows a device having a central processing unit (CPU) and two memories.

FIG. 1 shows a block diagram of a device 100 having a CPU 110 and memories 120 and 130. CPU 110 may comprise any type of processor such as a digital signal processor (DSP), a general-purpose processor, a micro-processor, a reduced instruction set computing (RISC) processor, a complex instruction set computing (CISC) processor, etc. Memories 120 and 130 may be the same or different types of memories. For example, memory 120 may be a synchronous dynamic random access memory (SDRAM), and memory 130 may be a Flash memory such as a NAND Flash or a NOR Flash. CPU 110 and memories 120 and 130 may be implemented on a single IC such as an application specific integrated circuit (ASIC). Alternatively, CPU 110 and memories 120 and 130 may be implemented on separate ICs.

CPU 110 includes input/output interface circuit (I/O Ckt) 112 for exchanging data with memory 120. Memory 120 includes I/O circuits 122 and 124 for exchanging data with CPU 110 and memory 130, respectively. Memory 130 includes I/O circuit 132 for exchanging data with memory 120. It may be desirable to operate the interfaces between CPU 110 and memories 120 and 130 at clock rates that are as high as possible in order to improve data throughput. High clock rates may be supported by using the delay circuits described herein in I/O circuits 112, 122, 124 and 132.

Figure 2:
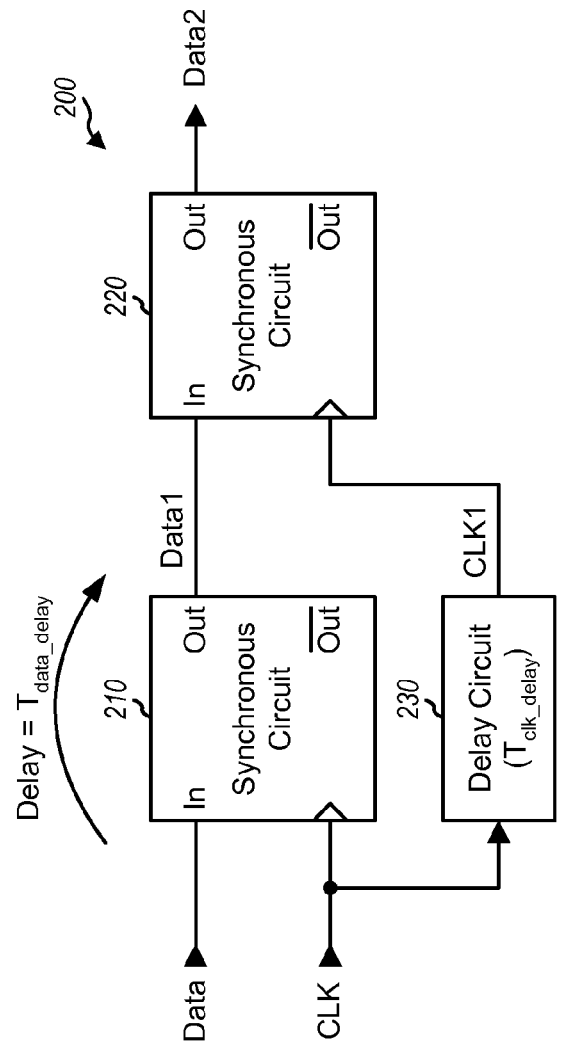
FIG. 2 shows an input interface circuit.

FIG. 2 shows a schematic diagram of a design of an input interface circuit 200, which may be used in each of the I/O circuits in FIG. 1. In this design, input interface circuit 200 includes two synchronous circuits 210 and 220 and a delay circuit 230. Each synchronous circuit may comprise a latch, a flip-flop, etc. Synchronous circuit 210 receives input data Data and provides output data Data1. Synchronous circuit 220 receives input data Data1 and provides output data Data2. A clock signal CLK is provided to a clock input of synchronous circuit 210 and also to delay circuit 230. Delay circuit 230 provides a delayed clock signal CLK1 to the clock input of synchronous circuit 220.

Figure 3:
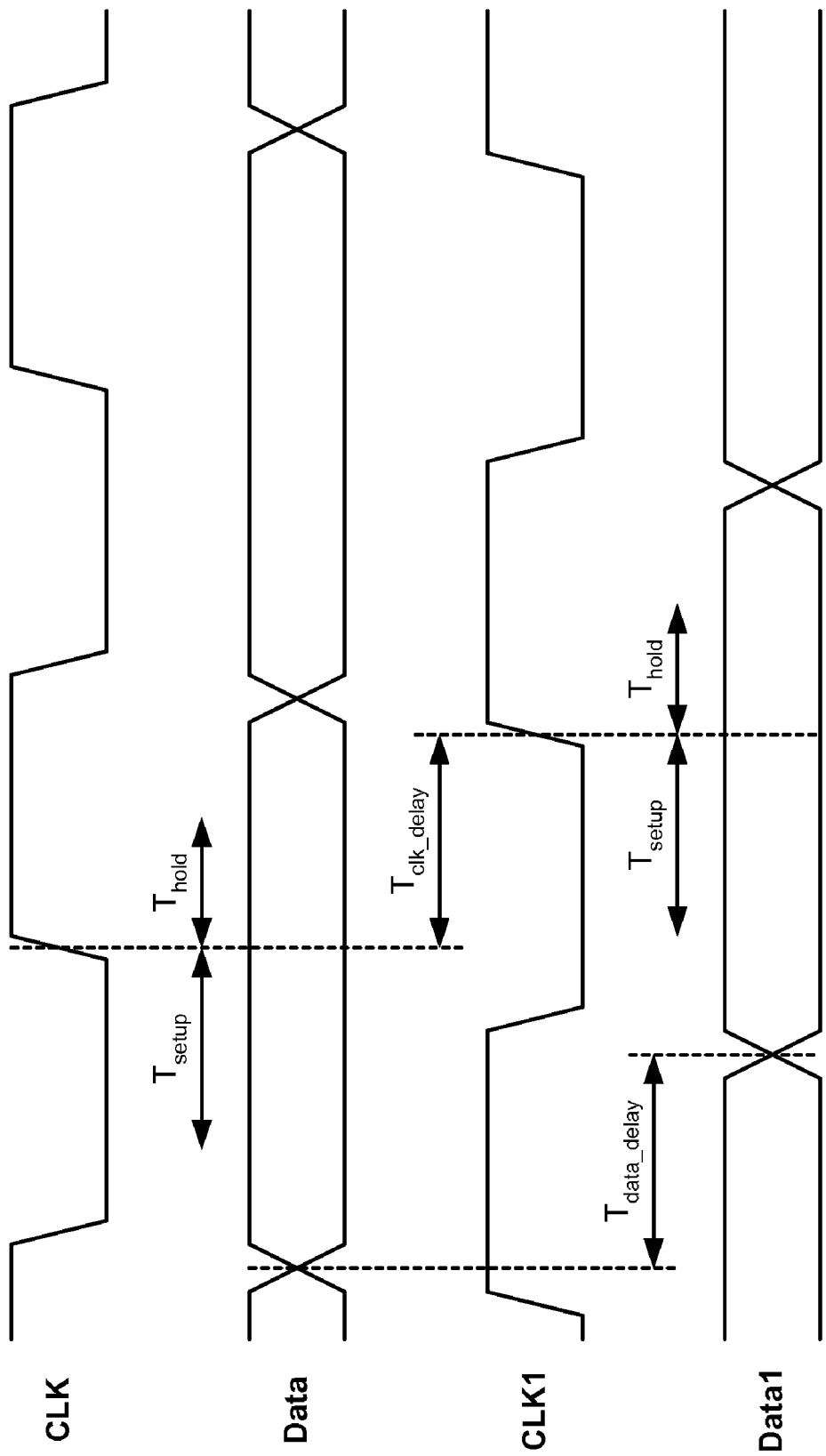
FIG. 3 shows a timing diagram for the input interface circuit in FIG. 2.

FIG. 3 shows a timing diagram for input interface circuit 200 in FIG. 2. The input data Data and the clock signal CLK for synchronous circuit 210 may be properly time aligned to provide good margin for timing requirements such as setup time $T_{setup}$ and hold time $T_{hold}$ for synchronous circuit 210. The output data Data1 from synchronous circuit 210 may be delayed relative to the input data Data by a clock-to-output (C-to-Q) propagation delay $T_{data\_delay}$. This data delay may be dependent on the design of synchronous circuit 210 as well as PVT variations.

It is desirable to properly time align the input data Data1 and the clock signal CLK1 for synchronous circuit 220 to achieve good margin for timing requirements for synchronous circuit 220. To obtain proper time alignment, the clock signal CLK1 for synchronous circuit 220 may be delayed relative to the clock signal CLK for synchronous circuit 210 by a delay of $T_{clk\_delay}$, which should match the data delay $T_{data\_delay}$ of synchronous circuit 210 across PVT variations. This would then ensure that similar timing margins can be achieved for synchronous circuits 210 and 220.

Delay circuit 230 may be implemented with a set of inverters coupled in series. A suitable number of inverters may be selected such that the clock delay matches the data delay under nominal conditions, e.g., nominal IC process, nominal power supply voltage, and room temperature. The clock delay may then match the data delay under nominal conditions but may vary widely from the data delay across PVT variations. This is because the architecture of the synchronous circuit may differ greatly from the architecture of the delay circuit, and the architectural differences may result in the data and clock delays not tracking well across PVT variations.

In an aspect, a delay circuit may be implemented with the same or similar architecture as a synchronous circuit whose propagation delay is being tracked by the delay circuit. The delay circuit may be implemented with different designs depending on the type of latch or flip-flop being tracked as well as the specific design of the latch or flip-flop. For clarity, some example delay circuit designs are described below.

FIG. 4A shows a schematic diagram of a design of a D latch 410. Within D latch 410, an inverter 412 has its input coupled to a D input of the latch and its output coupled to a first input of an AND gate 414. An AND gate 416 has its first input coupled to the D input. The second inputs of AND gates 414 and 416 are coupled to a clock input of D latch 410. The outputs of AND gates 414 and 416 are coupled to first inputs of NOR gates 418 and 420, respectively. NOR gates 418 and 420 are cross-coupled in a feedback configuration and have their second inputs coupled to the outputs of NOR gates 420 and 418, respectively. The outputs of NOR gates 418 and 420 are coupled to the Q and $\overline{Q}$ outputs, respectively, of D latch 410. D latch 410 includes a forward path composed of inverter 412, AND gate 414, and NOR gate 418. The right side of FIG. 4A shows a symbol for D latch 410.

D latch 410 operates as follows. When the clock input of D latch 410 is at logic high, AND gates 414 and 416 are enabled and pass the inverted input data $\overline{Din}$ and the input data Din to NOR gates 418 and 420, respectively. The output Q and the inverted output $\overline{Q}$ are then dependent on the input data Din. NOR gates 418 and 420 capture an input data value when the clock input transitions to logic low (which disables AND gates 414 and 416) and store the captured value while the clock input is at logic low. NOR gate 418 provides the captured value as the output data Dout.

FIG. 4B shows a schematic diagram of a design of a delay circuit 430, which is based on D latch 410 in FIG. 4A. Delay circuit 430 can provide a delay closely matching the delay of D latch 410. Delay circuit 430 includes inverter 412, AND gates 414 and 416, and NOR gates 418 and 420, which are coupled as described above for FIG. 4A with the following differences. First, the second inputs of AND gates 414 and 416 are coupled to a power supply voltage $V_{DD}$ (instead of the clock input) to always enable these AND gates. Second, the feedback loop is broken, and the second input of NOR gate 418 is coupled to circuit ground (instead of the output of NOR gate 420) to pass the output of inverter 412 through NOR gate 418. The output of NOR gate 418 is coupled to the second input of NOR gate 420 to achieve the same output loading as in D latch 410. The output of NOR gate 418 is coupled to the Q output of delay circuit 430, and the output of NOR gate 420 is not used.

FIG. 4B also shows a symbol for delay circuit 430. An input signal Sin may be provided to the D input of delay circuit 430, and a delayed input signal Sout may be provided by the Q output of delay circuit 430. The Sout signal would observe similar delay as the output data Dout of D latch 410. Delay circuit 430 may be used to delay the clock signal CLK to match the delay of D latch 410. In this case, the Sin signal may be the clock signal CLK, and the Sout signal may be the delayed clock signal CLK1.

FIG. 5A shows a schematic diagram of a design of a D latch 510. Within D latch 510, a switch 512 has one input coupled to a D input of the D latch and another input coupled to the input of an inverter 516. A switch 514 has one input coupled to the input of inverter 516 and another input coupled to the output of an inverter 518. The output of inverter 516 is coupled to the $\overline{Q}$ output of D latch 510 and also to the input of inverter 518. The output of inverter 518 is coupled to the Q output of D latch 510. A control input of switch 512 and the input of an inverter 520 are both coupled to a clock input of D latch 510. The output of inverter 520 is coupled to a control input of switch 514. D latch 510 includes a forward patch composed of switch 512 and inverters 516 and 518. FIG. 5A also shows a symbol for D latch 510.

D latch 510 operates as follows. When the clock input of D latch 510 is at logic high, switch 512 is closed, switch 514 is opened, and the input data Din is passed through inverters 516 and 518 and provided as the output data Dout. When the clock input transitions to logic low, switch 512 is opened, switch 514 is closed, and inverters 516 and 518 capture and store an input data value via positive feedback.

FIG. 5B shows a schematic diagram of a design of a delay circuit 530, which is based on D latch 510 in FIG. 5A. Delay circuit 530 includes switches 512 and 514 and inverters 516, 518 and 520, which are coupled as described above for FIG. 5A with the following difference. The control input of switch 512 and the input of inverter 520 are coupled to the supply voltage $V_{DD}$ (instead of the clock input) to always enable switch 512 and disable switch 514. Inverters 516 and 518 in delay circuit 530 observe similar loading as inverters 516 and 518 in D latch 510. FIG. 5B also shows a symbol for delay circuit 530.

FIG. 6A shows a schematic diagram of a design of an SR latch 610. Within SR latch 610, NAND gates 614 and 616 have their first inputs coupled to S and R inputs, respectively, and their second inputs coupled to a clock input of SR latch 610. The outputs of NAND gates 614 and 616 are coupled to first inputs of NAND gates 618 and 620, respectively. NAND gates 618 and 620 are cross-coupled in a feedback configuration and have their second inputs coupled to the outputs of NAND gates 620 and 618, respectively. The outputs of NAND gates 618 and 620 are coupled to the Q and $\overline{Q}$ outputs, respectively, of SR latch 610. SR latch 610 includes a forward path composed of NAND gates 614 and 618. FIG. 6A also shows a symbol for SR latch 610.

SR latch 610 operates as follows. When the clock input of SR latch 610 is at logic high, NAND gates 614 and 616 are enabled. The Q output is set to logic high if the S input is at logic high and reset to logic low if the R input is at logic high. When the clock input of SR latch 610 is at logic low, NAND gates 614 and 616 are disabled, and NAND gates 618 and 620 capture and store an input data value.

FIG. 6B shows a schematic diagram of a design of a delay circuit 630, which is based on SR latch 610 in FIG. 6A. Delay circuit 630 includes NAND gates 614, 616, 618 and 620, which are coupled as described above for FIG. 6A with the following differences. First, the second inputs of NAND gates 614 and 616 are coupled to the supply voltage $V_{DD}$ (instead of the clock input) to always enable NAND gates 614 and 616. Second, the feedback loop is broken, and the second input of NAND gate 618 is coupled to the supply voltage $V_{DD}$ (instead of the output of NAND gate 620) to pass the input signal through NAND gates 614 and 618. The output of NAND gate 618 is coupled to the Q output of delay circuit 630. The R input and the $\overline{Q}$ output are not used for delay circuit 630.

FIGS. 4A, 5A and 6A show some example designs of D and SR latches. The D and SR latches may also be implemented with other designs. FIGS. 4B, 5B and 6B show example designs of delay circuits for the D and SR latch designs shown in FIGS. 4A, 5A and 6A, respectively. Delay circuits may also be implemented for other types of latches such as JK latch.

In general, a delay circuit for a latch may be implemented with the same or similar circuit architecture used for the latch. In one design, the delay circuit is based on a replica of the latch. For the delay circuit, the forward path may be enabled, and the feedback loop may be broken. For example, the feedback loop may be broken by removing the connection between the output of NOR gate 420 and the input of NOR gate 418 in FIG. 4A, opening switch 514 in FIG. 5A, and removing the connection between the output of NAND gate 620 and the input of NAND gate 618 in FIG. 6A. For the delay circuit, the clock/control signal as well as the disconnected gate input due to the broken feedback loop may be coupled to the supply voltage and/or circuit ground, as appropriate, to always enable the delay circuit. The delay circuit is thus an open loop configuration of the latch and has similar loading as the latch. By implementing the delay circuit with the same or similar circuit architecture, logic gates, and loading, the delay of the delay circuit may closely match the propagation delay of the latch over PVT variations. Furthermore, accurate delay matching may be achieved without using programmable circuitry, calibration, etc.

In other designs, a delay circuit may include a subset of the logic gates in a latch. One or more logic gates may be omitted in order to reduce logic gate count for the delay circuit. For delay circuit 430 in FIG. 4B, AND gate 416 and/or NOR gate 420 may be omitted. For delay circuit 530 in FIG. 5B, switch 514 and/or inverter 520 may be omitted. For delay circuit 630 in FIG. 6B, NAND gate 616 and/or 620 may be omitted. The omitted logic gate(s) may affect loading, which may result in less accurate delay matching. The omitted logic gate(s) may be accounted for by adding capacitance, by adjusting the size of the logic gates that are present, etc.

FIG. 7A shows a schematic diagram of a design of an edge-triggered D flip-flop 700, which includes two D latches 710a and 710b and an inverter 732. Inverter 732 receives the clock signal CLK and provides an inverted clock signal CLKB. D latch 710a receives the input data Din at its D input and the clock signal CLK at its clock input. D latch 710b receives the inverted clock signal CLKB at its clock input and has its D input coupled to the Q output of D latch 710a.

In the design shown in FIG. 7A, D latches 710a and 710b are each implemented with D latch 410 in FIG. 4A. The second inputs of AND gates 414a and 416a in D latch 710a receive the clock signal CLK. The second inputs of AND gates 414b and 416b in D latch 710b receive the inverted clock signal CLKB. The outputs of NOR gates 418b and 420b are coupled to the Q and $\overline{Q}$ outputs, respectively, of D flip-flop 700. D flip-flop 700 includes a forward path composed of inverter 412a, AND gate 414a and NOR gate 418a in D latch 710a and inverter 412b, AND gate 414b and NOR gate 418b in D latch 710b.

FIG. 7B shows a schematic diagram of a design of a delay circuit 730, which is based on D flip-flop 700 in FIG. 7A. Delay circuit 730 includes delay cells 740a and 740b that are coupled in series. Delay cell 740a receives an input signal Sin at its input and provides its output to delay cell 740b. Delay cell 740b provides a delayed input signal Sout. In the design shown in FIG. 7B, delay cells 740a and 740b are each implemented with delay circuit 430 in FIG. 4B. Inverter 412a and AND gate 416a in delay cell 740a receive the input signal Sin. Inverter 412b and AND gate 416b in delay cell 740b are coupled to the output of NOR gate 418a in delay cell 740a. NOR gate 418b in delay cell 740b provides the delayed input signal Sout.

FIG. 8A shows a schematic diagram of a design of an edge-triggered D flip-flop 800. D flip-flop 800 includes two D latches 810a and 810b and an inverter 832 that are coupled in the same manner as D latches 710a and 710b and inverter 732 in D flip-flop 700 in FIG. 7A. D latches 810a and 810b are each implemented with D latch 510 in FIG. 5A. The control input of switch 512a and the input of inverter 520a in D latch 810a receive the clock signal CLK. The control input of switch 512b and the input of inverter 520b in D latch 810b receive the inverted clock signal CLK. The outputs of inverters 518b and 516b are coupled to the Q and $\overline{Q}$ outputs, respectively, of D flip-flop 800. D flip-flop 800 includes a forward path composed of switch 512a and inverters 516a and 518a in D latch 810a and switch 512b and inverters 516b and 518b in D latch 810b.

FIG. 8B shows a schematic diagram of a design of a delay circuit 830, which is based on D flip-flop 800 in FIG. 8A. Delay circuit 830 includes delay cells 840a and 840b that are coupled in series and in the same manner as delay cells 740a and 740b in delay circuit 730 in FIG. 7B. Delay cells 840a and

840b are each implemented with delay circuit 530 in FIG. 5B. Switch 512a in delay cell 840a receives the input signal Sin. Switch 512b in delay cell 840b is coupled to the output of inverter 518a in delay cell 840a. Inverter 518b in delay cell 840b provides the delayed input signal Sout.

FIG. 8C shows a schematic diagram of delay circuit 830, with the switches and inverters rearranged from the original location in FIG. 8B. For each delay cell 840, the forward path includes switch 512 and inverters 516 and 518, with switch 512 being always enabled. For each delay cell 840, the feedback path includes switch 514 that is always disabled but is coupled to the output of inverter 518 to match loading.

FIG. 8D shows a schematic diagram of a design of a delay circuit 832, which includes a subset of the logic gates in delay circuit 830 in FIG. 8C. Delay circuit 832 includes delay cells 842a and 842b coupled in series. Each delay cell 842 includes switch 512 and inverters 516 and 518 in the forward path. For each delay cell 842, switch 514 and inverter 520 are omitted to simplify the design of delay circuit 832. To further simplify design, two of the four inverters in the forward path may be omitted.

Figure 9A:
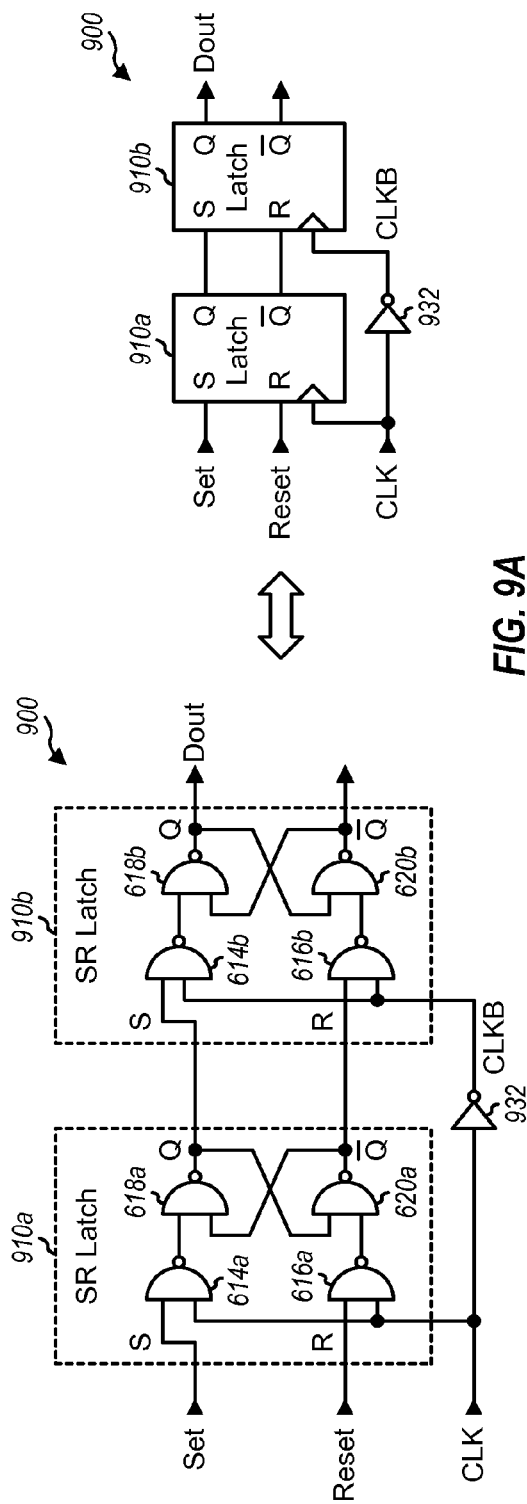
FIGS. 9A and 9B show an SR flip-flop and a corresponding delay circuit.

FIG. 9A shows a schematic diagram of a design of an edge-triggered SR flip-flop 900, which includes two SR latches 910a and 910b and an inverter 932. SR latch 910a receives a set signal at its S input, a reset signal at its R input, and the clock signal CLK at its clock input. SR latch 910b has its S and R inputs coupled to the Q and $\overline{Q}$ outputs, respectively, of SR latch 910a. SR latch 910b further receives the inverted clock signal CLKB at its clock input and provides the Q and $\overline{Q}$ outputs for SR flip-flop 900.

SR latches 910a and 910b are each implemented with SR latch 610 in FIG. 6A. The second inputs of NAND gates 614a and 616a in SR latch 910a receive the clock signal CLK. The second inputs of NAND gates 614b and 616b in SR latch 910b receive the inverted clock signal CLK. The outputs of NAND gates 618b and 620b are coupled to the Q and $\overline{Q}$ outputs, respectively, of SR flip-flop 900. SR flip-flop 900 includes a forward path composed of NAND gates 614a and 618a in SR latch 910a and NAND gates 614b and 618b in SR latch 910b.

Figure 9B:
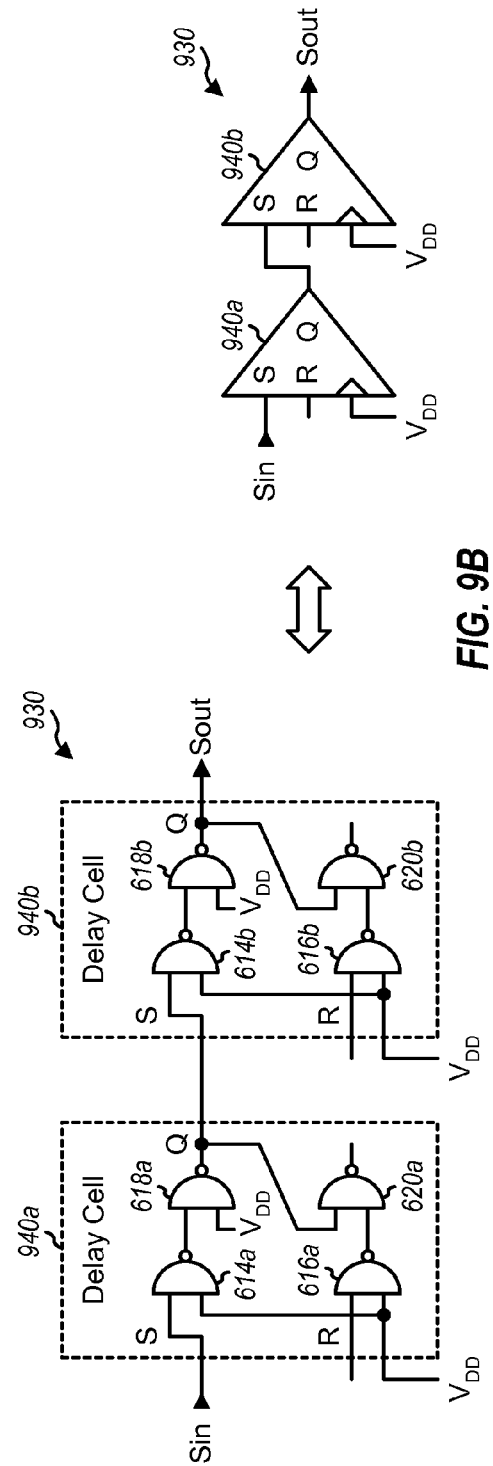

FIG. 9B shows a schematic diagram of a design of a delay circuit 930, which is based on SR flip-flop 900 in FIG. 9A. Delay circuit 930 includes delay cells 940a and 940b that are coupled in series. Delay cells 940a and 940b are each implemented with delay circuit 630 in FIG. 6B. NAND gate 614a in delay cell 940a receive the input signal Sin. NAND gate 614b in delay cell 940b is coupled to the output of NAND gate 618a in delay cell 940a. NAND gate 618b in delay cell 940b provides the delayed input signal Sout.

FIGS. 7A, 8A and 8A show some example designs of D and SR flip-flops. The D and SR flip-flops may also be implemented with other designs. FIGS. 7B, 8B and 9B show example designs of delay circuits for the D and SR flip-flop designs shown in FIGS. 7A, 8A and 8A, respectively. Delay circuits may also be implemented for other types of flip-flops such as JK flip-flop.

In general, a delay circuit for a flip-flop may be implemented with the same or similar circuit architecture used for the flip-flop. In one design, the delay circuit is based on a replica of the flip-flop. For the delay circuit, the feedback loops may be broken. The clock/control signal as well as the disconnected gate inputs due to the broken feedback loops may be coupled to the supply voltage and/or circuit ground, as appropriate, to always enable the delay circuit.

In other designs, a delay circuit may include a subset of the logic gates in a flip-flop. One or more logic gates may be omitted in order to reduce logic gate count for the delay circuit. For delay circuit 730 in FIG. 7B, AND gate 416a, AND gate 416b, NOR gate 420a and/or NOR gate 420b may be omitted. For delay circuit 830 in FIG. 8B, switch 514a, switch 514b, inverter 520a and/or inverter 520b may be omitted. For delay circuit 930 in FIG. 9B, NAND gate 616a, 616b, 620a and/or 620b may be omitted.

The logic gates in a delay circuit may also be arranged differently from the logic gates in a corresponding synchronous circuit. As an example, for delay circuit 832 in FIG. 8D, inverter 516a may be placed before switch 512a.

The delay circuits described herein may be used to delay clock and other signals by similar amounts as data signals from latches and flip-flops. The delay circuits may be used in high-speed interface circuits (e.g., as shown in FIG. 1) to time align the data and clock/strobe signals. These high-speed interface circuits may be for CPUs, memories, registers of programmable blocks, etc. The delay circuits may also be used for internal circuits where accurate delay matching of clock/control signals and data signals is desired.

The delay circuits described herein may be used for various applications such as communication, networking, computing, consumer electronics, etc. The delay circuits may be used for cellular phones, personal digital assistants (PDAs), wireless communication devices, handheld devices, wireless modems, laptop computers, cordless phones, etc. An exemplary use of the delay circuits in a wireless communication device is described below.

Figure 10:
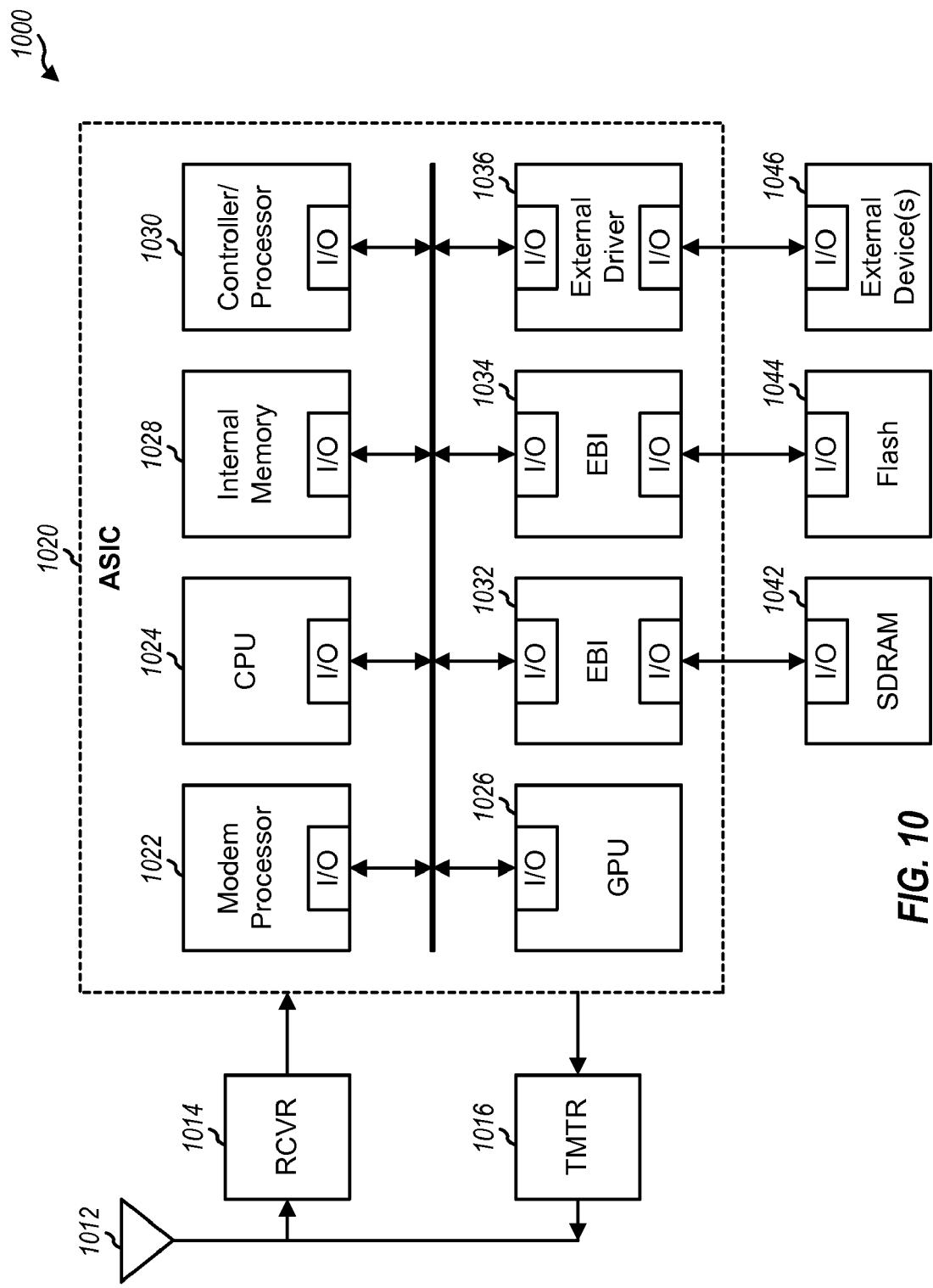
FIG. 10 shows a block diagram of a wireless communication device

FIG. 10 shows a block diagram of a design of a wireless communication device 1000 in a wireless communication system. Wireless device 1000 may be a cellular phone, a terminal, a handset, a PDA, etc. The wireless communication system may be a Code Division Multiple Access (CDMA) system, a Global System for Mobile Communications (GSM) system, etc.

Wireless device 1000 is capable of providing bi-directional communication via a receive path and a transmit path. On the receive path, signals transmitted by base stations (not shown) are received by an antenna 1012 and provided to a receiver (RCVR) 1014. Receiver 1014 conditions the received signal and provides an input signal to an ASIC 1020. On the transmit path, a transmitter (TMTR) 1016 receives and conditions an output signal from ASIC 1020 and generates a modulated signal, which is transmitted via antenna 1012 to the base stations.

ASIC 1020 may include various processing, interface, and memory units such as, e.g., a modem processor 1022, a CPU 1024, a graphics processing unit (GPU) 1026, an internal memory 1028, a controller/processor 1030, external bus interfaces (EBIs) 1032 and 1034, and an external driver 1036. Modem processor 1022 may perform processing for data transmission and reception, e.g., encoding, modulation, demodulation, decoding, etc. CPU 1024 may perform various types of processing for wireless device 1000, e.g., processing for higher layer applications. GPU 1026 may perform graphics and video processing for wireless device 1000. Internal memory 1028 may store data and/or instructions for various units within ASIC 1020. Controller/processor 1030 may direct the operation of various processing and interface units within ASIC 1020. EBI 1032 facilitates transfer of data between ASIC 1020 and an SDRAM 1042. EBI 1034 facilitates transfer of data between ASIC 1020 and a Flash memory 1044. External driver 1036 drives external device(s) 1046 via an analog or digital interface. The delay circuits described herein may be implemented (e.g., in I/O circuits) in any of the processing, memory and interface units shown in FIG. 10.

The delay circuits described herein may be implemented in various hardware units such as DSPs, digital signal processing devices (DSPDs), programmable logic devices (PLDs), field programmable gate arrays (FPGAs), processors, controllers, micro-controllers, microprocessors, electronics devices, memory devices, etc. The delay circuits may be used in various types of IC such as ASICs, mixed-signal ICs, radio frequency ICs (RFICs), etc. The delay circuits may be fabricated in various IC process technologies such as complementary metal oxide semiconductor (CMOS), N-channel MOS (N-MOS), P-channel MOS (P-MOS), bipolar junction transistor (BJT), bipolar CMOS (BiCMOS), silicon germanium (SiGe), gallium arsenide (GaAs), etc. The delay circuits may also be fabricated with any device size technology, e.g., 130 nanometer (nm), 90 nm, 65 nm, 45 nm, 32 nm, etc.

An apparatus implementing the delay circuits described herein may be a stand-alone device or may be part of a larger device. A device may be (i) a stand-alone IC, (ii) a set of one or more ICs that may include memory ICs for storing data and/or instructions, (iii) an ASIC such as a mobile station modem (MSM), (iv) an RFIC such as an RF receiver (RFR) or an RF transmitter/receiver (RTR), (v) a module that may be embedded within other devices, (vi) a cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a synchronous circuit comprising a forward path from a data input to a data output, the synchronous circuit receiving input data and providing output data with a propagation delay; and
   a delay circuit to receive an input signal and provide a delayed input signal having a delay matching the propagation delay of the synchronous circuit, the delay circuit comprising a plurality of logic gates, wherein each logic gate of the plurality is based on a respective logic gate of the same type within the synchronous circuit.

2. The apparatus of claim 1, the synchronous circuit comprising a pair of logic gates coupled in a feedback configuration, the delay circuit comprising the pair of logic gates with the feedback broken.

3. The apparatus of claim 2, the pair of logic gates for the delay circuit comprising first and second logic gates, the first logic gate having an output coupled to an input of the second logic gate and providing the delayed input signal, the second logic gate having an output disconnected from an input of the second logic gate.

4. The apparatus of claim 2, the pair of logic gates comprising inverters, or NOR gates, or NAND gates.

5. The apparatus of claim 1, the synchronous circuit comprising a D latch having at least one inverter and at least one switch in the forward path, the delay circuit comprising at least one inverter and at least one switch.

6. The apparatus of claim 1, the synchronous circuit comprising a flip-flop having first and second latches coupled in series, the first latch receiving the input data and a clock signal, the second latch receiving an inverted clock signal and providing the output data, the delay circuit comprising first and second delay cells coupled in series, the first delay cell receiving the input signal and the second delay cell providing the delayed input signal.

7. The apparatus of claim 6, the first and second latches each comprising a pair of logic gates coupled in a feedback configuration, the first delay cell being based on a replica of the first latch with the pair of logic gates having the feedback broken and the clock signal replaced with a static logic value to always enable the first delay cell, the second delay cell being based on a replica of the second latch with the pair of logic gates having the feedback broken and the inverted clock signal replaced with the static logic value.

8. The apparatus of claim 1, the synchronous circuit providing the output data based on a clock signal, the delay circuit receiving the clock signal as the input signal and providing a delayed clock signal as the delayed input signal.

9. The apparatus of claim 1, the synchronous circuit and the delay circuit being based on a common circuit architecture.

10. The apparatus of claim 1, the delay circuit being based on a replica of the synchronous circuit, the replica having a clock input coupled to a static logic value to always enable the delay circuit.

11. The apparatus of claim 1, the delay circuit comprising all logic gates in the forward path of the synchronous circuit.

12. The apparatus of claim 1, the delay circuit comprising at least two of the following an inverter, an AND gate, a NAND gate, a NOR gate, and a switch.

13. The apparatus of claim 1 the synchronous circuit comprising at least one of the following a D latch, an SR latch, a JK latch, a D flip-flop, an SR flip-flop, and a JK flip-flop.

14. An integrated circuit comprising:
    a synchronous circuit comprising a forward path from a data input to a data output, the synchronous circuit receiving input data and providing output data with a propagation delay; and
    a delay circuit to receive an input signal and provide a delayed input signal having a delay matching the propagation delay of the synchronous circuit, the delay circuit comprising a plurality of logic gates, wherein each logic gate of the plurality is based on a respective logic gate of the same type within the synchronous circuit.

15. The integrated circuit of claim 14, the synchronous circuit comprising a pair of logic gates coupled in a feedback configuration, the delay circuit comprising the pair of logic gates with the feedback broken.

16. The integrated circuit of claim 14, the synchronous circuit comprising a flip-flop having first and second latches coupled in series, the first latch receiving the input data and a clock signal, the second latch receiving an inverted clock signal and providing the output data, the delay circuit comprising first and second delay cells coupled in series, the first delay cell receiving the input signal and the second delay cell providing the delayed input signal.

17. The integrated circuit of claim 14, the delay circuit being based on a replica of the synchronous circuit, the replica having a clock input coupled to a static logic value to always enable the delay circuit.

18. An apparatus comprising:
    a first synchronous circuit comprising a forward path from a data input to a data output, the first synchronous circuit receiving first input data and providing first output data with a propagation delay based on a clock signal;
    a second synchronous circuit coupled to the first synchronous circuit and receiving the first output data and providing second output data based on a delayed clock signal; and
    a delay circuit to receive the clock signal and provide the delayed clock signal having a delay matching the propagation delay of the first synchronous circuit, the delay circuit comprising a plurality of logic gates, wherein each logic gate of the plurality is based on a respective logic gate of the same type within the synchronous circuit.

19. The apparatus of claim 18, the first synchronous circuit comprising a pair of logic gates coupled in a feedback configuration, the delay circuit comprising the pair of logic gates with the feedback broken.

20. The apparatus of claim 18, the first synchronous circuit comprising a flip-flop having first and second latches coupled in series, the delay circuit comprising first and second delay cells coupled in series, the first delay cell receiving the clock signal and the second delay cell providing the delayed clock signal.

21. The apparatus of claim 18, the first and second synchronous circuits and the delay circuit being part of an input interface circuit for a central processing unit (CPU) or a memory.

22. A method comprising:
providing output data with a synchronous circuit comprising a forward path from a data input to a data output, the output data being provided with a propagation delay relative to input data; and
delaying an input signal with a delay circuit to obtain a delayed input signal having a delay matching the propagation delay of the synchronous circuit, the delay circuit comprising a plurality of logic gates, wherein each logic gate of the plurality is based on a respective logic gate of the same type within the synchronous circuit.

23. The method of claim 22, further comprising:
operating the synchronous circuit based on a clock signal; and
enabling the delay circuit by coupling a clock input of the delay circuit to a static logic value.

24. An apparatus comprising:
means for providing output data with a synchronous circuit comprising a forward path from a data input to a data output, the output data being provided with a propagation delay relative to input data; and
means for delaying an input signal with a delay circuit to obtain a delayed input signal having a delay matching the propagation delay of the synchronous circuit, the delay circuit comprising a plurality of logic gates, wherein each logic gate of the plurality is based on a respective logic gate of the same type within the synchronous circuit.

25. The apparatus of claim 24, further comprising:
means for operating the synchronous circuit based on a clock signal; and
means for enabling the delay circuit by coupling a clock input of the delay circuit to a static logic value.

* * * * *